United States Patent
Kim et al.

(10) Patent No.: US 8,127,172 B2
(45) Date of Patent: Feb. 28, 2012

(54) APPARATUS AND METHOD FOR RECEIVING PARALLEL SFI-5 DATA INTERFACED WITH VERY HIGH-SPEED DESERIALIZER

(75) Inventors: Jongho Kim, Daejeon (KR); Jong Yoon Shin, Daejeon (KR); Je Soo Ko, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 533 days.

(21) Appl. No.: 12/316,280

(22) Filed: Dec. 11, 2008

(65) Prior Publication Data
US 2009/0150708 A1    Jun. 11, 2009

(30) Foreign Application Priority Data
Dec. 11, 2007    (KR) .................. 10-2007-0128223

(51) Int. Cl.
*G06F 1/04* (2006.01)
(52) U.S. Cl. ........................ 713/503; 710/71
(58) Field of Classification Search .................. 713/503; 710/71
See application file for complete search history.

(56) References Cited

U.S. PATENT DOCUMENTS

| | | | |
|---|---|---|---|
| 7,441,139 B2 * | 10/2008 | Kuwata | 713/503 |
| 7,937,605 B2 * | 5/2011 | Rea et al. | 713/503 |
| 2007/0006053 A1 | 1/2007 | Otto et al. | |
| 2007/0050658 A1 | 3/2007 | Kuwata | |
| 2009/0129455 A1 * | 5/2009 | Kim et al. | 375/228 |
| 2009/0138749 A1 * | 5/2009 | Moll et al. | 713/503 |

FOREIGN PATENT DOCUMENTS

| | | |
|---|---|---|
| EP | 1 289 212 A1 | 3/2003 |
| KR | 100656377 B1 | 5/2006 |
| KR | 10-0669931 B1 | 1/2007 |

OTHER PUBLICATIONS

Mattia, J.P., et al., "An OC-768 Transponder for 40 and 43 Gb/s Short-Reach Links," 2003 IEEE GaAs Digest (2003) pp. 27-30.

* cited by examiner

*Primary Examiner* — Glenn A Auve
(74) *Attorney, Agent, or Firm* — Blakely, Sokoloff, Taylor & Zafman (57) ABSTRACT

The development of transmission technologies have resulted in a several tens Gbps optical transmission system. In the present invention, a low-speed FPGA receives a plurality of several Gbps signals according to a very high-speed parallel converting unit and the SFI-5, divides each of the plurality of several Gbps signals into a plurality of several hundreds (Mbps) parallel signals, and processes the plurality of several hundreds (Mbps) parallel signals in order to constitute an SFI-5 receiving end.

12 Claims, 8 Drawing Sheets

APPARATUS AND METHOD FOR RECEIVING PARALLEL SFI-5 DATA INTERFACED WITH VERY HIGH-SPEED DESERIALIZER

CROSS-REFERENCE TO RELATED PATENT APPLICATION

This application claims the benefit of Korean Patent Application No. 10-2007-0128223, filed on Dec. 11, 2007, in the Korean Intellectual Property Office, the disclosure of which is incorporated herein in its entirety by reference.

BACKGROUND OF THE INVENTION

1. Field of the Invention

The present invention relates to a receiving apparatus, and more particularly to, a receiving apparatus and method in view of the SerDes Framer Interface Level 5 (SFI-5).

The present invention is derived from a research project supported by the Information Technology (IT) Research & Development (R&D) program of the Ministry of Information and Communication (MIC) and the Institute for Information Technology Advancement (IITA) [2006-S-060-02, Development of OTH-based 40 G Multi-service Transmission Technology].

2. Description of the Related Art

The SerDes Framer Interface Level 5 (SFI-5) is a standardized electrical interface standard defined by the optical internetworking forum (OIF) in order to facilitate communication of several tens of Gbps of very high-speed data signals between devices. According to the SFI-5, each of a sending end and a receiving end communicate 16 several Gpbs data signals that are divided from a several tens of Gpbs data signal. The length of a physical line connected to each of the 16 several Gpbs data signals can be different and thus, a delay of each several Gpbs data signal can be different. The difference in delay between the 16 several Gpbs data signals is referred to as a skew. In order to allow each several Gpbs data signal to have a consistent delay, a receiving apparatus according to the SFI-5 compensates for a skew between the received several Gpbs data signals, and performs signal processing with regard to the several Gpbs data signals having the compensated skew. The receiving apparatus according to the SFI-5 receives a deskew signal that is a signal obtained by multiplexing a sampling value of each several Gpbs data signal, and the 16 several Gpbs data signals, compares each value of the received several Gpbs data signals with a sampling value included in the received deskew signal, calculates a delay of each several Gpbs data signal, and compensates for a skew of the received 16 several Gpbs data signals in view of the delay.

When a plurality of several Gpbs data signals that are divided from a several tens of Gpbs data level according to the SFI-5 are received, it is necessary to design and develop an expensive high-speed application specific integrated circuit (ASIC) in order to receive and process the plurality of several Gpbs data signals. However, since a great amount of time and money are required to design and develop the ASIC, a method of receiving and processing several Gpbs data signals that are divided from a several tens of Gpbs data level according to the SFI-5 is needed.

SUMMARY OF THE INVENTION

The present invention provides a parallel receiving apparatus having a field programmable gate array (FPGA) for receiving and processing several Gpbs data signals that are divided from a several tens of Gpbs data level according to the SerDes Framer Interface Level 5 (SFI-5).

The present invention also provides a parallel receiving method used for an FPGA for receiving and processing several Gpbs data signals that are divided from a several tens of Gpbs data level according to the SFI-5.

The present invention also provides a computer readable recording medium storing a program for executing the parallel receiving method used for an FPGA for receiving and processing several Gpbs data signals that are divided from a several tens of Gpbs data level according to the SFI-5.

According to an aspect of the present invention, there is provided a parallel receiving apparatus comprising: a very high-speed parallel converting unit dividing an input data signal into a plurality of first parallel signals, sampling each of the plurality of first parallel signals, and generating a first deskew signal; and a field programmable gate array (FPGA) simultaneously receiving the plurality of first parallel signals and the first deskew signal, dividing each of the plurality of first parallel signals into a plurality of second parallel signals, dividing the first deskew signal into a plurality of second deskew signals, adjusting skews between the plurality of second parallel signals based on the plurality of second deskew signals, and performing predetermined signal processing with regard to the plurality of second parallel signals having the adjusted skews.

The FPGA may comprise: a plurality of gigabit transceivers dividing each of the plurality of first parallel signals into the plurality of second parallel signals, and dividing the first deskew signal into the plurality of second deskew signals; a parallel receiving unit comparing the plurality of second parallel signals with the plurality of second deskew signals, and adjusting the skews between the plurality of second parallel signals based on the comparison result; and a signal processing unit performing the predetermined signal processing with regard to the second parallel signals having the adjusted skews.

The parallel receiving unit may comprise: a header detecting unit realigning the plurality of second deskew signals to be predetermined bit signals for each clock; and a skew adjusting unit comparing the plurality of second parallel signals that is divided from each of the plurality of first parallel signals with the realigned second deskew signals, and adjusting the skews between the plurality of second parallel signals based on the comparison result.

The skew adjusting unit may comprise: a plurality of parallel processing units each comparing the plurality of second parallel signals that are divided from each of the plurality of first parallel signals with the realigned second deskew signals and calculating a delay value of each of the plurality of second parallel signals that are divided from each of the plurality of first parallel signals; a signal based delay value calculating unit correcting each delay value of the plurality of second parallel signals that are divided from the same first parallel signal to be consistent; and a plurality of delay units each respectively delaying each of the plurality of second parallel signals that are divided from each of the plurality of first parallel signals by a time related to the corrected delay value.

The FPGA may discover a point within the second parallel signal in which pattern of the second parallel signal is consistent with that of the plurality of second deskew signals for each of the second parallel signals, and adjusts the skew between the plurality of second parallel signals based on the discovered points.

The FPGA may move at least a part of bits constituting the second parallel signal on a time axis until pattern of the second parallel signal is consistent with that of the plurality of second deskew signals, and discovers the point of the second parallel signal in which pattern of the second parallel signals is consistent with that of the plurality of second deskew signals.

According to another aspect of the present invention, there is provided a parallel receiving method comprising: dividing an input data signal into a plurality of first parallel signals, sampling each of the plurality of first parallel signals, and generating a first deskew signal; and simultaneously receiving the plurality of first parallel signals and the first deskew signal, dividing each of the plurality of first parallel signals into a plurality of second parallel signals, dividing the first deskew signal into a plurality of second deskew signals, adjusting skews between the plurality of second parallel signals based on the plurality of second deskew signals, and performing predetermined signal processing with regard to the plurality of second parallel signals having the adjusted skews, wherein a field programmable gate array (FPGA) performs the simultaneously receiving of the plurality of first parallel signals and the first deskew signal.

The simultaneously receiving of the plurality of first parallel signals and the first deskew signal may comprise: dividing each of the plurality of first parallel signals into the plurality of second parallel signals, and dividing the first deskew signal into the plurality of second deskew signals; comparing the plurality of second parallel signals with the plurality of second deskew signals, and adjusting the skews between the plurality of second parallel signals based on the comparison result; and performing the predetermined signal processing with regard to the second parallel signals having the adjusted skews.

The comparing of the plurality of second parallel signals may comprise: realigning the plurality of second deskew signals to be predetermined bit signals for each clock; and comparing the plurality of second parallel signals that is divided from each of the plurality of first parallel signals with the realigned second deskew signals, and adjusting the skews between the plurality of second parallel signals based on the comparison result.

The comparing of the plurality of second parallel signals may comprise: comparing the plurality of second parallel signals for each of the plurality of first parallel signals with the realigned second deskew signals and calculating a delay value of each of the plurality of second parallel signals for each of the plurality of first parallel signals; correcting each delay value of the plurality of second parallel signals that are divided from the same first parallel signal to be consistent; and delaying each of the plurality of second parallel signals for each of the plurality of first parallel signals by a time related to the corrected delay value.

The simultaneously receiving of the plurality of first parallel signals and the first deskew signal may comprise: discovering a point within the second parallel signal in which pattern of the second parallel signal is consistent with that of the plurality of second deskew signals for each of the second parallel signals, and adjusts the skew between the plurality of second parallel signals based on the discovered points.

The simultaneously receiving of the plurality of first parallel signals and the first deskew signal may comprises: moving at least a part of bits constituting the second parallel signal on a time axis until pattern of the second parallel signal is consistent with that of the plurality of second deskew signals, and discovers the point of the second parallel signal in which pattern of the second parallel signals is consistent with that of the plurality of second deskew signals.

According to another aspect of the present invention, there is provided a parallel receiving method comprising: dividing an input data signal into a plurality of first parallel signals, sampling each of the plurality of first parallel signals, and generating a first deskew signal; and simultaneously receiving the plurality of first parallel signals and the first deskew signal, dividing each of the plurality of first parallel signals into a plurality of second parallel signals, dividing the first deskew signal into a plurality of second deskew signals, adjusting skews between the plurality of second parallel signals based on the plurality of second deskew signals, and performing predetermined signal processing with regard to the plurality of second parallel signals having the adjusted skews, wherein a field programmable gate array (FPGA) performs the simultaneously receiving of the plurality of first parallel signals and the first deskew signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 1:
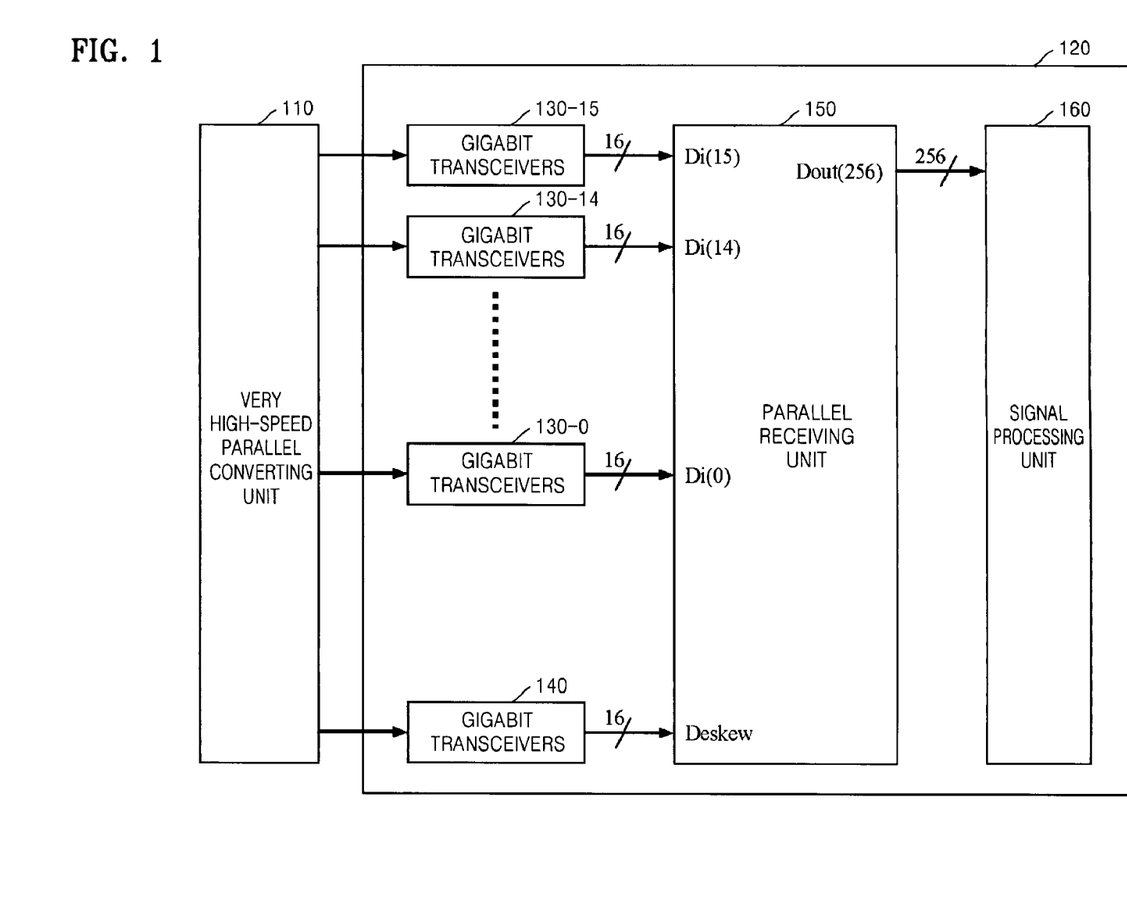
FIG. 1 is a block diagram of a parallel receiving apparatus according to an embodiment of the present invention.

FIG. 1 is a block diagram of a parallel receiving apparatus according to an embodiment of the present invention. Referring to FIG. 1, the parallel receiving apparatus comprises a very high-speed parallel converting unit 110 and a field programmable gate array (FPGA) 120. The FPGA 120 comprises a gigabit transceivers 130-0, 130-1, . . . 130-15, and 140, a parallel receiving unit 150, and a signal processing unit 160.

The very high-speed parallel converting unit 110 receives a several tens Gpbs (for example, 40 Gpbs) data signal, and divides the data signal into a plurality of first parallel signals. Hereinafter, it is assumed that the plurality of first parallel signals are several Gpbs (for example, 2.5 Gpbs) data signals, and the very high-speed parallel converting unit 110 divides a several tens Gpbs data signal into 16 several Gpbs data signals.

The very high-speed parallel converting unit 110 performs sampling with regard to each first parallel signal, and generates a first deskew signal. In more detail, the very high-speed parallel converting unit 110 performs sampling with regard to each first parallel signal, multiplexes sampled values and a header with regard to the sampled values, and generates the first deskew signal.

The FPGA 120 simultaneously receives the first parallel signals and the first deskew signal from the very high-speed parallel converting unit 110.

The FPGA 120 divides each of the received first parallel signals into a plurality of second parallel signals. For descriptive convenience, it is assumed that the plurality of second parallel signals are several hundreds Mbps (for example, 160 (Mbps) data signals, and the FPGA 120 divides each of the received first parallel signals into 16 second parallel signals.

The FPGA 120 divides the received first deskew signal into a plurality of second deskew signals. For descriptive convenience, it is assumed that the plurality of second deskew signals are several hundreds (Mbps) (for example, 160 (Mbps)) data signals, and the FPGA 120 divides the received first deskew signal into 16 second deskew signals.

On the other hand, the length of a physical line connected to each first parallel signal can be different so that each first and second parallel signal can have a different delay. As described in the Description of the Related Art section, the difference in delay between data signals is referred to as a skew. The FPGA 120 adjusts a skew between the second parallel signals in view of the second deskew signals, and performs predetermined signal processing with regard to the second parallel signals having the adjusted skew. In the present invention, adjusting of a skew between data signals means compensating of the skew between data signals in order to allow data signals to have a consistent delay. In the present invention, the predetermined signal processing means signal processing in a previously established manner. In more detail, the FPGA 120 performs the predetermined signal processing with regard to the second parallel signals in the previously established manner. The predetermined signal processing can have a variety of modifications.

The operation of the FPGA 120 will now be described in more detail.

Each of the gigabit transceivers 130-0, 130-1, . . . 130-15, and 140 receives the first parallel signals that was input into the FPGA 120.

The gigabit transceiver 130-$n$ ($0 \leq n \leq 15$) divides the received first parallel signal into a plurality of second parallel signals. For descriptive convenience, it is assumed that the gigabit transceiver 130-$n$ divides the received first parallel signal into 16 second parallel signals.

The gigabit transceiver 140 receives the first deskew signal that was input into the FPGA 120.

The gigabit transceiver 140 divides the first deskew signal into a plurality of second deskew signals. For descriptive convenience, it is assumed that the gigabit transceiver 140 divides the received first deskew signal into 16 second deskew signals.

The parallel receiving unit 150 comprises a plurality of input terminals and a single output terminal. In more detail, the parallel receiving unit 150 receives the 16 second parallel signals via the input terminal Di(n), and receives the 16 second deskew signals via the input terminal Deskew.

The parallel receiving unit 150 compares the 16 second parallel signals via the input terminal Di(n) with the 16 second deskew signals via the input terminal Deskew, and adjusts skews between the 16 second parallel signals via the input terminal Di(n) according to the comparison result. In the same manner, the parallel receiving unit 150 adjusts skews between the 256 second parallel signals that are input via the input terminals D(0) through D(15), and sends the 256 second parallel signals having the adjusted skews via the output terminal Dout(256) to the signal processing unit 160.

The signal processing unit 160 performs the predetermined signal processing with regard to the 256 second parallel signals having the adjusted skews.

Figure 2:
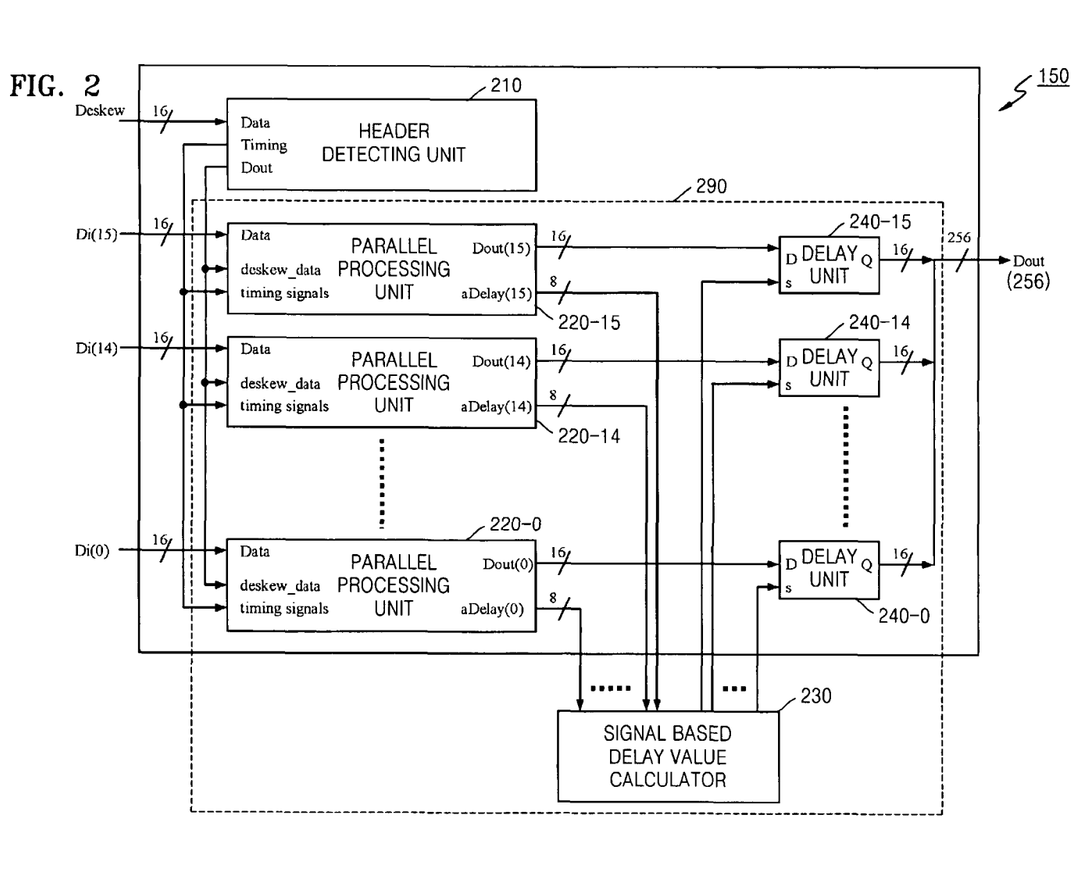
FIG. 2 is a detailed block diagram of a parallel receiving unit shown in FIG. 1.

FIG. 2 is a detailed block diagram of the parallel receiving unit 150 shown in FIG. 1. Referring to FIG. 2, the parallel receiving unit 150 comprises a header detecting unit 210, and a skew adjusting unit 290 comprising a plurality of parallel processing units 220-0, 220-1, . . . , 220-15, a signal based delay value calculator 230, and a plurality of delay units 240-0, 240-1, . . . , 240-15.

The header detecting unit 210 detects a header from the second deskew signals that are input via the input terminal Deskew, and realigns the received second deskew signals to have a uniform byte size (for example, 2 bytes) for each clock.

Thereafter, the header detecting unit 210 generates 16 timing signals. Each timing signal corresponds to each of the 16 first parallel signals that are input into the FPGA 120, and indicates the realigned second deskew signal corresponding to each first parallel signal.

The header detecting unit 210 sends the realigned second deskew signals to the parallel processing units 220-0, 220-1, . . . , 220-15 via the output terminal Dout. Thus, each of the parallel processing units 220-0, 220-1, . . . , 220-15 receives the second deskew signals via an input terminal deskew_data.

The header detecting unit 210 sends each of the 16 timing signals to the parallel processing units 220-0, 220-1, . . . , 220-15 via an output terminal Timing. Thus, the parallel processing unit 220-$n$ receives, via an input terminal timing signals, the timing signals corresponding to the first parallel signals that are divided into the second parallel signals via the input terminal Di(n) of the FPGA 120.

The skew adjusting unit 290 compares the second parallel signals of each first parallel signal with the realigned second deskew signals, and adjusts skews between the second parallel signals based on the comparison result.

The parallel processing unit 220-$n$ receives and compares the second parallel signals with the realigned second deskew signals, and calculates a delay value of each of the received second parallel signals based on the comparison result.

The signal based delay value calculator 230 corrects each delay value calculated by the parallel processing unit 220-$n$ to be consistent. In more detail, the signal based delay value calculator 230 calculates a skew correction delay value for correcting each delay value calculated by the parallel processing unit 220-$n$ to be consistent.

The delay unit 240-$n$ receives and delays each second parallel signal by a time related to the corrected delay value with regard to each second parallel signal.

The operation of the skew adjusting unit 290 will now be described in more detail.

The parallel processing unit 220-$n$ receives, via an input terminal Data, the second parallel signals that are input via the input terminal Di(n) of the parallel receiving unit 150, calculates the delay value of each of the received second parallel signals, sends the calculated delay values to the signal based delay value calculator 230 via an output terminal aDelay(n).

The parallel processing unit 220-$n$ sends the second parallel signals that are input via the input terminal Di(n) of the parallel receiving unit 150 to the delay unit 240-$n$ via an output terminal Dout(n).

The signal based delay value calculator 230 receives the calculated delay value from each of the parallel processing units 220-0, 220-1, . . . , 220-15, selects a maximum value from the received delay values, and calculates each difference between the maximum value and the received delay values as the skew correction delay value. For example, if a maximum value of the delay values that are received from the parallel processing units 220-0, 220-1, ..., 220-15 is 8, a delay value calculated by the parallel processing unit 220-*n* with regard to the second parallel signal, a, is 3, a delay value calculated by the parallel processing unit 220-*n* with regard to the second parallel signal, b, is 5, a delay value calculated by the parallel processing unit 220-*n* with regard to the second parallel signal, c, is 8, the signal based delay value calculator 230 calculates the skew correction delay value with regard to the second parallel signal, a, is 5, calculates the skew correction delay value with regard to the second parallel signal, b, is 3, and calculates the skew correction delay value with regard to the second parallel signal, c, is 0.

Each of the delay units 240-0, 240-1, ..., 240-15 is implemented as a D-flipflop.

The delay unit 240-*n* delays each second parallel signal that is input via an input terminal D from the parallel processing unit 220-*n* by a time related to the skew correction delay value calculated with regard to each second parallel signal. The delay unit 240-*n* receives the skew correction delay value calculated by the signal based delay value calculator 230 via an input terminal s.

The delay unit 240-*n* delays each of the 16 second parallel signals by the time related to the skew correction delay value calculated with regard to each 16 second parallel signal, and outputs the 16 second parallel signals that are delayed by the time related to the skew correction delay value via an output terminal Q. The parallel receiving unit 150 outputs the 256 second parallel signals having the adjusted skew via the output terminal Dout(256).

Figure 3:
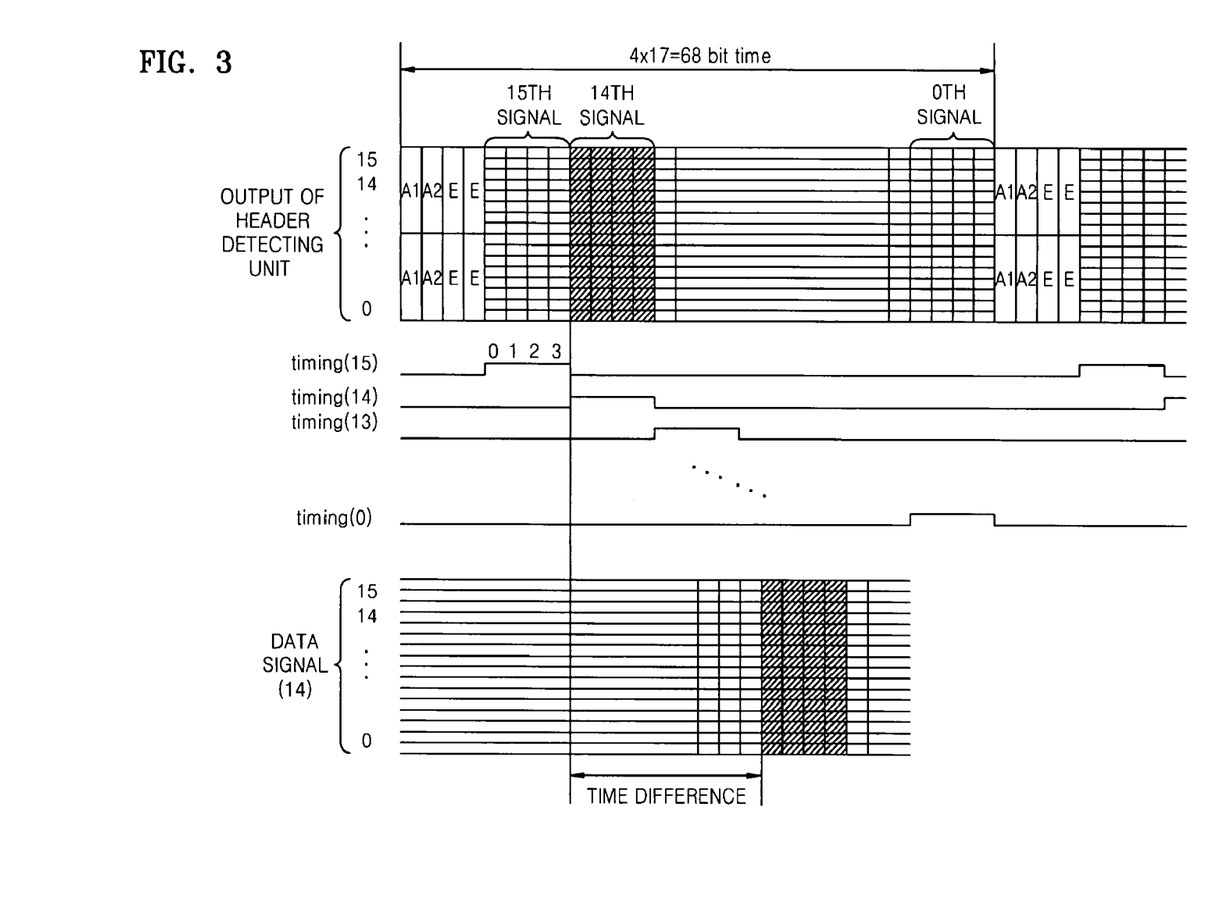
FIG. 3 is a diagram for explaining the operation of a header detecting unit shown in FIG. 2.

FIG. 3 is a diagram for explaining the operation of the header detecting unit 210 shown in FIG. 2. The gigabit transceiver 130-*n* receives and divides the first deskew signal at random, and generates the 16 second deskew signals. The header detecting unit 210 receives the 16 second deskew signals, detects the header from the received 16 second deskew signals, realigns the received second deskew signals in a byte unit, and outputs the realigned second deskew signals via the output terminal Dout.

Referring to FIG. 3, the header detecting unit 210 detects the header from the second deskew signals that are input via the input terminal Deskew, and realigns the second deskew signals to be a 2-byte signal for each clock. The header comprises A1, A1, A2, A2, E, E, E, and E. The realigned second deskew signals comprise the header, $15^{th}$ sampling values of the first parallel signals (=64 bits), $14^{th}$ sampling values of the first parallel signals (=64 bits), ..., $1^{st}$ sampling values of the first parallel signals (=64 bits), and $0^{th}$ sampling values of the first parallel signals (=64 bits), which appear during four clocks.

In the present invention, a single frame can be a single first deskew signal, or the second deskew signals divided from the single first deskew signal. The single frame comprises the header, $15^{th}$ sampling values of the first parallel signals (=64 bits), $14^{th}$ sampling values of the first parallel signals (=64 bits), ..., $1^{st}$ sampling values of the first parallel signals (=64 bits), and $0^{th}$ sampling values of the first parallel signals (=64 bits). Thus, the single frame corresponds to 4*17=68 bit time.

The header detecting unit 210 generates the 16 timing signals in view of the realigned second deskew signals.

The parallel processing unit 220-*n* discovers points of the second parallel signals in which a pattern of each second parallel signal that is input into the parallel processing unit 220-*n* is consistent with that of each second deskew signal that is input into the parallel processing unit 220-*n*, and adjusts skews between the second parallel signals that are input into the parallel processing unit 220-*n* based on the points of the second parallel signals that are input into the parallel processing unit 220-*n*. The parallel processing unit 220-*n* moves at least a part of bits constituting the second parallel signals on a time axis until the pattern of each second parallel signal that is input into the parallel processing unit 220-*n* is consistent with that of each second deskew signal that is input into the parallel processing unit 220-*n*, and discovers the points of the second parallel signals in which the pattern of each second parallel signal is consistent with that of each second deskew signal.

In FIG. 3, the operation of the parallel processing unit 220-14 among the parallel processing units 220-0, 220-1, ..., 220-15 is explained.

The parallel processing unit 220-14 discovers points of the second parallel signals in which a pattern of each second parallel signal that is input into the parallel processing unit 220-14 is consistent with that of each second deskew signal that is input into the parallel processing unit 220-14, and adjusts skews between the second parallel signals that are input into the parallel processing unit 220-*n* based on the points of the second parallel signals that are input into the parallel processing unit 220-14.

Data signal 14 is 16 second parallel signals that are input into the parallel processing unit 220-14. An output of the header detecting unit is the realigned second deskew signals that are output by the header detecting unit 210.

Referring to FIG. 3, a slashed part of the output of the header detecting unit is the same as that of the data signal 14. In more detail, a time difference is a difference between a point where a pattern of the second parallel signals that are input into the parallel processing unit 220-14 appears and a point where a pattern of the second deskew signals that are input into the parallel processing unit 220-14.

Figure 4:
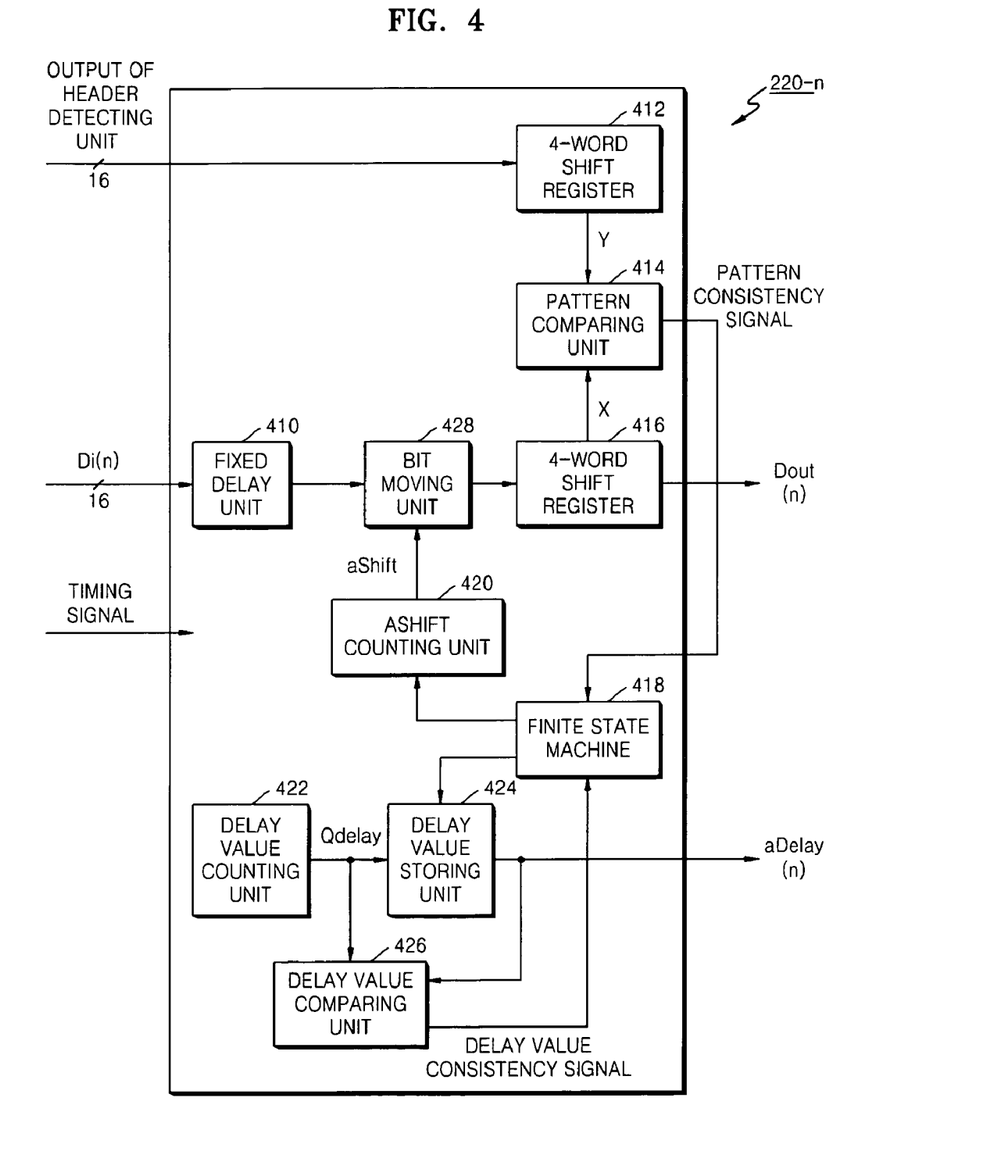
FIG. 4 is a detailed block diagram of a parallel processing unit shown in FIG. 2.

FIG. 4 is a detailed block diagram of the parallel processing unit 220-*n* shown in FIG. 2. Referring to FIG. 4, the parallel processing unit 220-*n* comprises a fixed delay unit 410, a 4-word shift register 412, a pattern comparing unit 414, a 4-word shift register 416, a finite state machine 418, a aShift counting unit 420, a delay value counting unit 422, a delay value storing unit 424, a delay value comparing unit 426, and a bit moving unit 428.

The fixed delay unit 410 delays the second parallel signals received via the input terminal of the parallel receiving unit 150 by a predetermined amount in order to delay the second parallel signals by the signal processing time in the header detecting unit 210.

Figure 5:
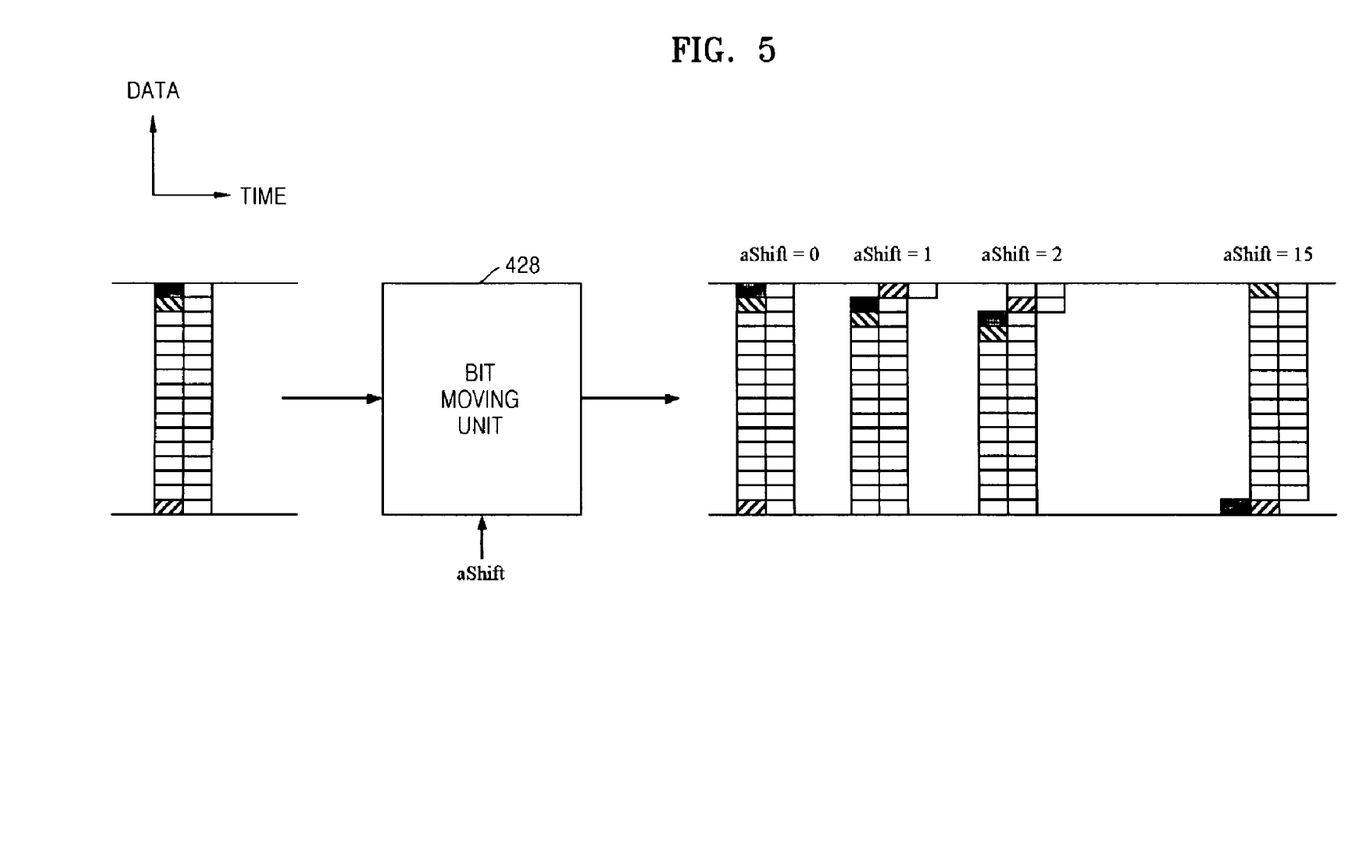
FIG. 5 is a diagram for explaining the operation of a bit moving unit shown in FIG. 4.

The bit moving unit 428 receives an aShift signal and outputs a bit moved signal as shown in FIG. 5 that is a diagram for explaining the operation of the bit moving unit 428 shown in FIG. 4. The gigabit transceiver 130-*n* divides the first parallel signal at random, and generates the 16 second parallel signals that are to be received via the input terminal Di(n) of the parallel receiving unit 150. Since the 16 second parallel signals are not aligned in a byte unit, the bit moving unit 428 needs to receive the 16 second parallel signals, and appropriately bit-move at least a part of bits constituting the 16 second parallel signals by changing the aShift signal in the same manner as shown in FIG. 5. In more detail, the bit moving unit 428 needs to move at least a part of bits constituting the 16 second parallel signals on a time axis by changing the aShift signal.

Figure 6:
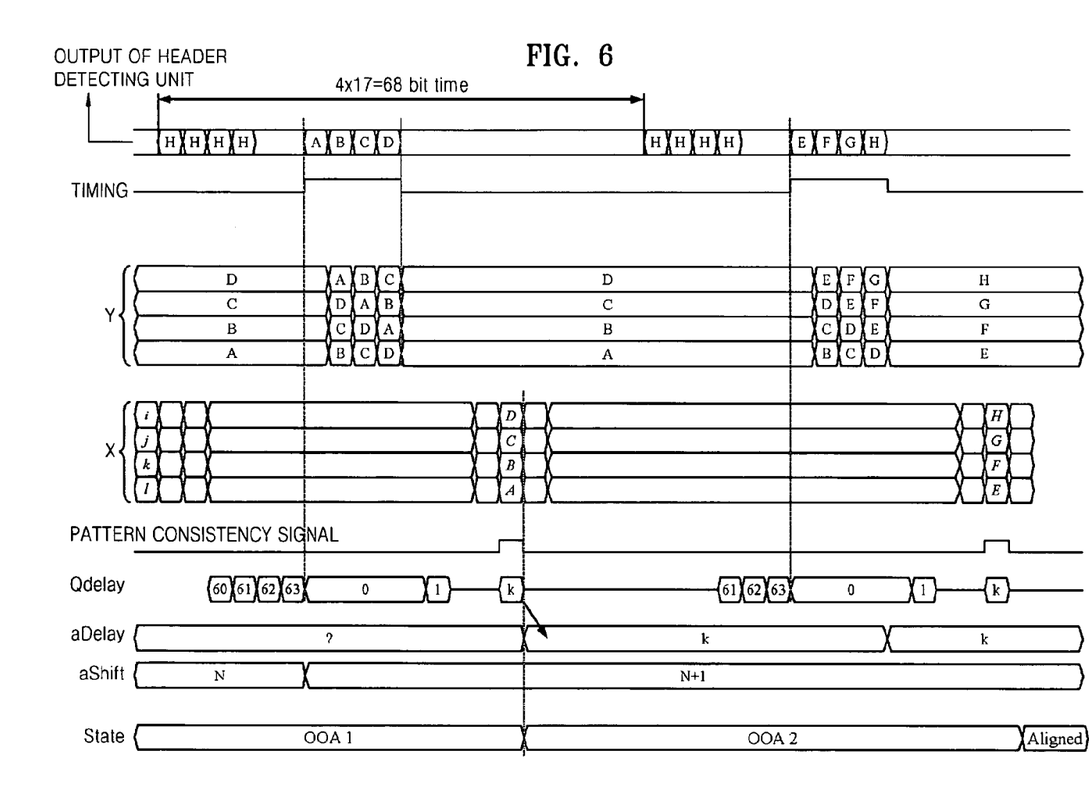
FIG. 6 is a diagram for explaining the operation of a finite state machine shown in FIG. 4.

FIG. 6 is a diagram for explaining the operation of the finite state machine 418 shown in FIG. 4 Referring to FIG. 6, an output of the bit moving unit 428 is stored in the 4-word shift register 416. A word refers to 16 bits. The realigned second deskew signals that are received from the header detecting unit 210 are sampled at a point where the realigned second deskew signals correspond to the timing signals (indicating the second parallel signals that are received via the input terminal Di(n) of the parallel receiving unit 150) that are received in the parallel processing unit 220-n, and the sampled values are stored in the 4-word shift register 412 as shown in FIG. 3. The pattern comparing unit 414 compares the 4-word output of each of the 4-word shift registers 412 and 416, and generates a pattern consistency signal indicating whether patterns are consistent.

The finite state machine 418 receives the pattern consistency signal from the pattern comparing unit 414, determines whether patterns are consistent, and generates the aShift signal. The finite state machine 418 performs signal processing every frame. As an example, OOA1 indicates an initial state, OOA2 indicates a state where patterns are consistent once, Aligned 1 indicates a normal state where patterns are consistent more than twice and a normal operation is performed, and Aligned 2 indicates a normal state where patterns are not consistent. Such four intermediate states are established to prevent a state transit caused by a transmission error, etc. Other intermediate states can be defined. The operation from the initial state (OOA1 state) will now be described. If patterns are not consistent according to the pattern consistency signal in the OOA1 state, the aShift counting unit 420 repeatedly performs a processing of increasing an aShift value by 1 and determining whether patterns are consistent in a next frame. If the aShift value is increased by 1, the bit moving unit 428 outputs the bit moved signal as shown in FIG. 5. If patterns are consistent according to the pattern consistency signal in the OOA1 state, a value of the aShift counting unit 420 that generates the aShift signal is fixed, a Qdelay value, which is an output of the delay value counting unit 422, is stored in the delay value storing unit 424, and thus the OOA1 state is transited to the OOA2 state. Thereafter, it is determined whether patterns are consistent in a next frame. If patterns are not consistent according to the pattern consistency signal in the OOA2 state, the OOA2 state is transited to the OOA1 state, and the above process is repeated. If patterns are consistent according to the pattern consistency signal in the OOA2 state, the Qdelay value is compared with the value stored in the delay value storing unit 424 in a previous frame, and it is determined whether points where patterns are consistent are identical. If points are not identical, since patterns are consistent in a point different from the previous frame, the Qdelay value is stored in the delay value storing unit 424 again, and the OOA2 state is maintained. If a pattern consistency point of the previous frame is consistent with that of the current frame, since patterns are consistent in a correct point twice consecutively, the OOA2 state is transited to the Aligned 1 state. In the Aligned 1 state, it is determined whether patterns are consistent every frame and whether points where patterns are consistent are identical, and, if both conditions are satisfied, the finite state machine 418 remains in the normal state. If one of both conditions is not satisfied, the Aligned 1 state is transited to the Aligned 2 state, if both conditions are not satisfied in a next frame, the Aligned 2 state is transited to the OOA1 state, the above operation is resumed. If both conditions are satisfied, the Aligned 2 state is transited to the Aligned 1 state. When the finite state machine 418 is in the normal state, the aDelay value is a-comparative delay value of the second parallel signals that are input in the parallel processing unit 220-n with regard to the realigned second deskew signals that are output from the header detecting unit 210. The operation of the finite state machine 418 can be described with reference to FIG. 6. A period of a single frame refers to 68-bit time. In FIG. 6, Y indicates values stored in the 4-word shift register among the realigned second deskew signals that are output from the header detecting unit 210, and X indicates values stored in the 4-word shift register 416 with regard to the second parallel signals that are input via the input terminal Di(n) of the parallel receiving unit 150. If X and Y are not consistent, since the aShift signal increases by 1 in a frame unit, the X values are changed to the bit moved second parallel signals as shown in FIG. 5. Under the assumption that there is no error on a transmission path, the aShift signal increases by 1 from 0 to 15, since X values are bit moved once in a frame, X and Y values are surely supposed to be consistent at a value of the aShift signal between 0 and 15. Meanwhile, the Qdelay value is a signal that is initialized each frame according to the timing signals and increases by 1 as shown in FIG. 6. A frame includes 68-bit time in which a header occupies 4-bit time and thus, the Qdelay value has between 0 and 63. In FIG. 6, the aShift value increases by 1 from 0 to N+1 in which patterns are consistent. At this time, the pattern consistency signal is generated, and the delay value storing unit 424 stores the Qdelay value that is used to determine if the pattern consistency signal is generated at the same point in a next frame. In more detail, if the pattern consistency signal is generated in a point where Qdelay=k, the pattern consistency signal must be generated in the point where Qdelay=k in the next frame. A comparison of the Qdelay value with the stored aDelay value makes it possible to know whether a pattern consistency point of a previous frame is consistent with that of the current frame. The stored Qdelay value, that is the aDelay value, is a comparative delay value of the second parallel signals that are input in the parallel processing unit 220-n with regard to the realigned second deskew signals that are output from the header detecting unit 210.

Figure 7:
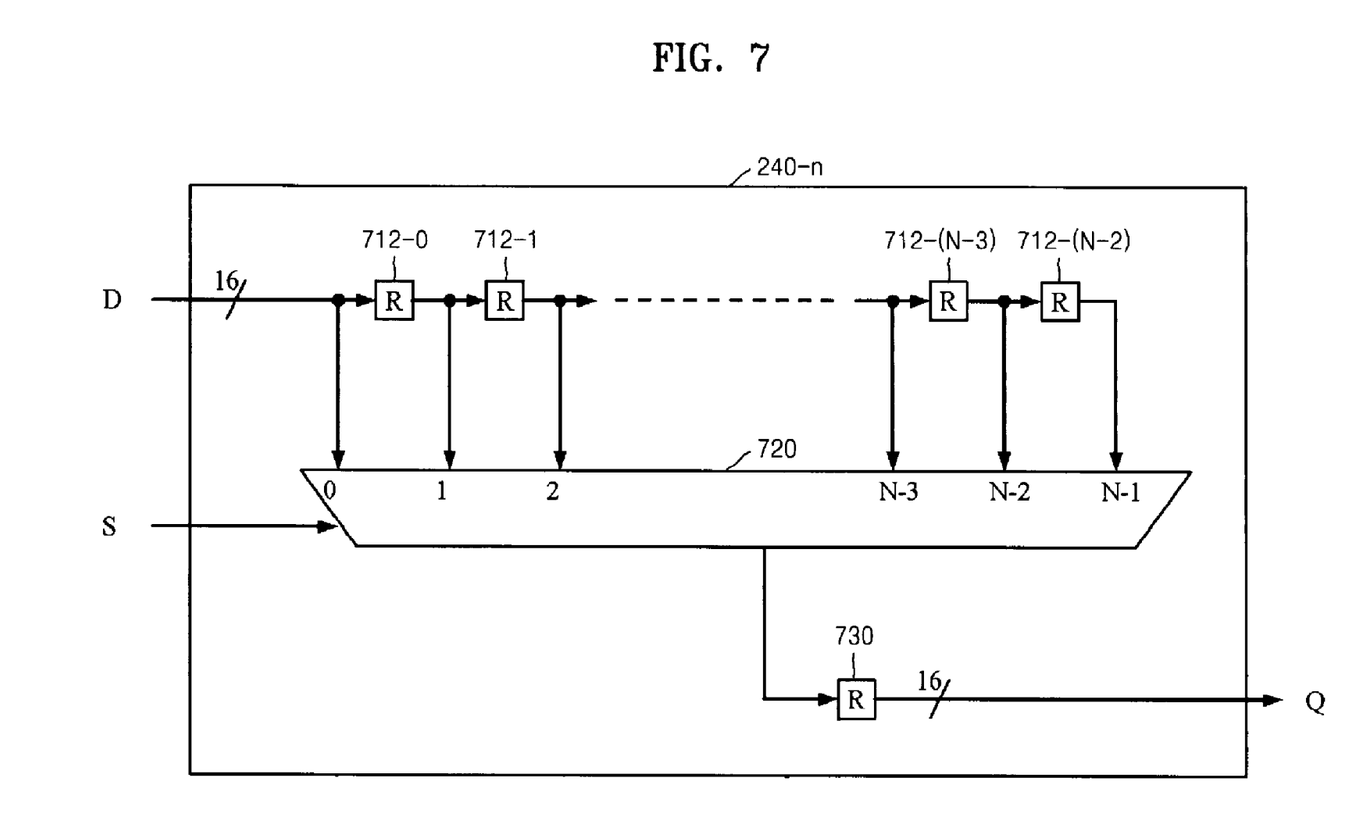
FIG. 7 is a block diagram for explaining a delay unit shown in FIG. 2.

FIG. 7 is a block diagram for explaining the delay unit 240-n shown in FIG. 2. Referring to FIG. 7, the delay unit 240-n connects each of the second parallel signals that are input via an input terminal D to a plurality of D flipflops 712-0, 712-1, . . . , 712-(N−3), 712-(N−2), constitutes and delays N word shift registers, inputs each output of the N word shift registers into a selecting unit 720, selects one input value corresponding to a skew correction delay value that is input via an input terminal S from the N input values, outputs the selected input value, retimes the output value to a D flipflop 730, and outputs the retiming result via an output terminal Q.

Figure 8:
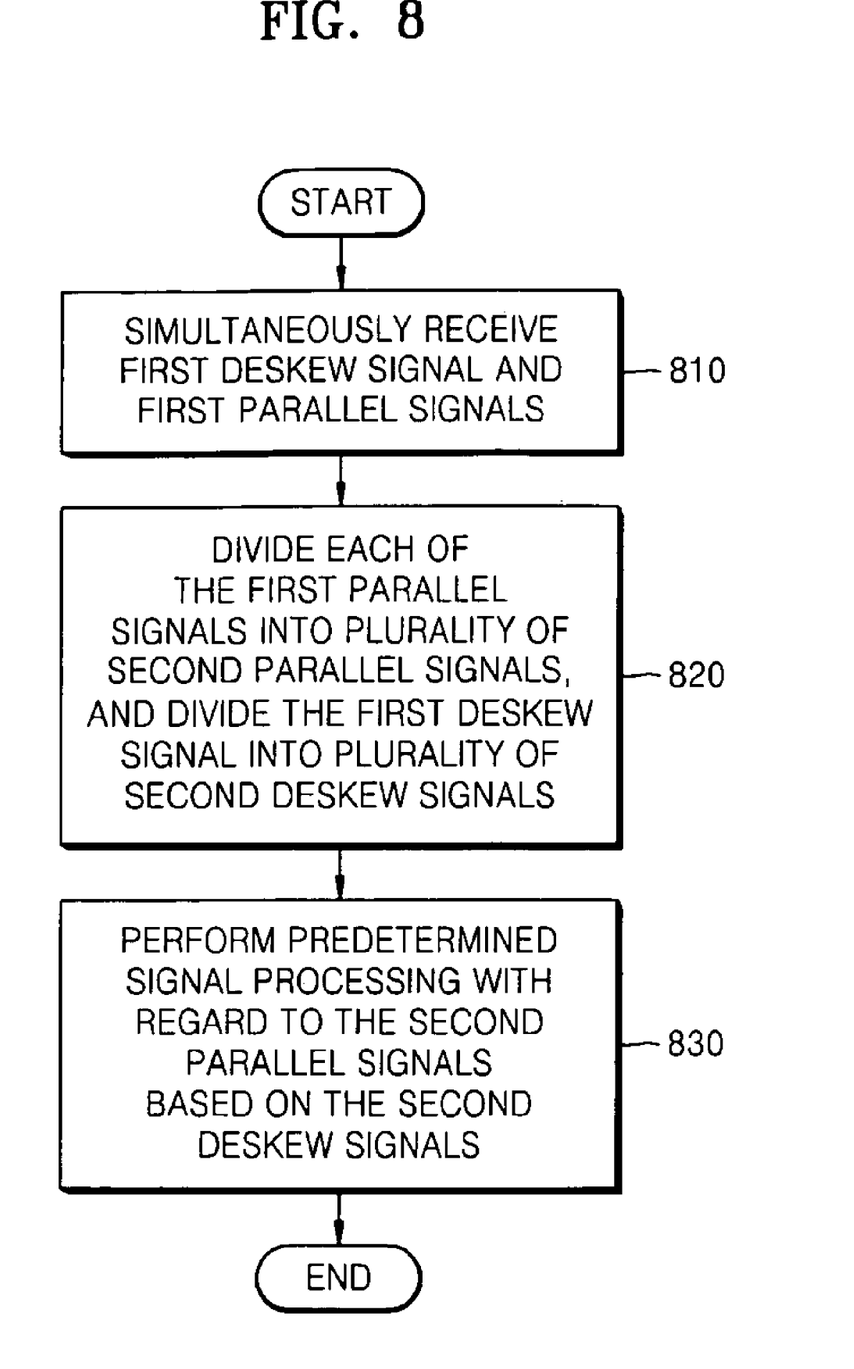
FIG. 8 is a flowchart illustrating a parallel receiving method according to an embodiment of the present invention.

FIG. 8 is a flowchart illustrating a parallel receiving method according to an embodiment of the present invention. Referring to FIG. 8, in operation 810, the FPGA 120 simultaneously receives a first deskew signal and first parallel signals from the very high-speed parallel converting unit 110.

In operation 820, the FPGA 120 divides each of the first parallel signals into a plurality of second parallel signals, and divides the first deskew signal into a plurality of second deskew signals.

In operation 830, the FPGA 120 adjusts skews between the second parallel signals based on the second deskew signals, and performs predetermined signal processing with regard to the second parallel signals having the adjusted skews.

The present invention can also be embodied as computer readable code on a computer readable recording medium. The computer readable recording medium is any data storage device that can store data which can be thereafter read by a computer system. Examples of the computer readable recording medium include read-only memory (ROM), random-access memory (RAM). CD-ROMs, magnetic tapes, floppy disks, and optical data storage devices.

According to the parallel receiving apparatus and method of the present invention, a several tens Gpbs data signal is divided according to the SFI-5, a plurality of several Gpbs data signals are simultaneously input into a FPGA, and each several Gpbs data signal is divided into a plurality of several hundreds Mbps data signals in the FPGA, and the divided several hundreds Mbps data signals are in parallel processed, thereby simultaneously receiving and processing the plurality of several Gpbs data signals.

Therefore, an application specific integrated circuit (ASIC) requiring a great amount of time and money in connection with the design and development thereof is not needed to realize a receiving apparatus for receiving and processing the plurality of several Gpbs data signals, but a low-priced FPGA can be used to realize the receiving apparatus, resulting in a more competitive price.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A parallel receiving apparatus comprising:
   a very high-speed parallel converting unit dividing an input data signal into a plurality of first parallel signals, sampling each of the plurality of first parallel signals, and generating a first deskew signal; and
   a field programmable gate array (FPGA) simultaneously receiving the plurality of first parallel signals and the first deskew signal, dividing each of the plurality of first parallel signals into a plurality of second parallel signals, dividing the first deskew signal into a plurality of second deskew signals, adjusting skews between the plurality of second parallel signals based on the plurality of second deskew signals, and performing predetermined signal processing with regard to the plurality of second parallel signals having the adjusted skews.

2. The parallel receiving apparatus of claim 1, wherein the FPGA comprises:
   a plurality of gigabit transceivers dividing each of the plurality of first parallel signals into the plurality of second parallel signals, and dividing the first deskew signal into the plurality of second deskew signals;
   a parallel receiving unit comparing the plurality of second parallel signals with the plurality of second deskew signals, and adjusting the skews between the plurality of second parallel signals based on the comparison result; and
   a signal processing unit performing the predetermined signal processing with regard to the second parallel signals having the adjusted skews.

3. The parallel receiving apparatus of claim 2, wherein the parallel receiving unit comprises:
   a header detecting unit realigning the plurality of second deskew signals to be predetermined bit signals for each clock; and
   askew adjusting unit comparing the plurality of second parallel signals that is divided from each of the plurality of first parallel signals with the realigned second deskew signals, and adjusting the skews between the plurality of second parallel signals based on the comparison result.

4. The parallel receiving apparatus of claim 3, wherein the skew adjusting unit comprises:
   a plurality of parallel processing units each comparing the plurality of second parallel signals that are divided from each of the plurality of first parallel signals with the realigned second deskew signals and calculating a delay value of each of the plurality of second parallel signals that are divided from each of the plurality of first parallel signals;
   a signal based delay value calculating unit correcting each delay value of the plurality of second parallel signals that are divided from the same first parallel signal to be consistent; and
   a plurality of delay units each respectively delaying each of the plurality of second parallel signals that are divided from each of the plurality of first parallel signals by a time related to the corrected delay value.

5. The parallel receiving apparatus of claim 1, wherein the FPGA discovers a point within the second parallel signal in which pattern of the second parallel signal is consistent with that of the plurality of second deskew signals for each of the second parallel signals, and adjusts the skew between the plurality of second parallel signals based on the discovered points.

6. The parallel receiving apparatus of claim 5, herein the FPGA moves at least a part of bits constituting the second parallel signal on a time axis until pattern of the second parallel signal is consistent with that of the plurality of second deskew signals, and discovers the point of the second parallel signal in which pattern of the second parallel signals is consistent with that of the plurality of second deskew signals.

7. A parallel receiving method comprising:
   dividing an input data signal into a plurality of first parallel signals, sampling each of the plurality of first parallel signals, and generating a first deskew signal; and
   simultaneously receiving the plurality of first parallel signals and the first deskew signal, dividing each of the plurality of first parallel signals into a plurality of second parallel signals, dividing the first deskew signal into a plurality of second deskew signals, adjusting skews between the plurality of second parallel signals based on the plurality of second deskew signals, and performing predetermined signal processing with regard to the plurality of second parallel signals having the adjusted skews.

8. The parallel receiving method of claim 7, wherein the simultaneously receiving of the plurality of first parallel signals and the first deskew signal comprises:
   dividing each of the plurality of first parallel signals into the plurality of second parallel signals, and dividing the first deskew signal into the plurality of second deskew signals;
   comparing the plurality of second parallel signals with the plurality of second deskew signals, and adjusting the skews between the plurality of second parallel signals based on the comparison result; and
   performing the predetermined signal processing with regard to the second parallel signals having the adjusted skews.

9. The parallel receiving method of claim 8, herein the comparing of the plurality second parallel signals comprises:
   realigning the plurality of second deskew signals to be predetermined bit signals for each clock; and
   comparing the plurality of second parallel signals that is divided from each of the plurality of first parallel signals with the realigned second deskew signals, and adjusting the skews between the plurality of second parallel signals based on the comparison result.

10. The parallel receiving method of claim 9, wherein the comparing of the plurality of second parallel signals comprises:

comparing the plurality of second parallel signals for each of the plurality of first parallel signals with the realigned second deskew signals and calculating a delay value of each of the plurality of second parallel signals for each of the plurality of first parallel signals;

correcting each delay value of the plurality of second parallel signals that are divided from the same first parallel signal to be consistent; and delaying each of the plurality of second parallel signals for each of the plurality of first parallel signals by a time related to the corrected delay value.

11. The parallel receiving method of claim 7, wherein the simultaneously receiving of the plurality of first parallel signals and the first deskew signal comprises: discovering a point within the second parallel signal in which pattern of the second parallel signal is consistent with that of the plurality of second deskew signals for each of the second parallel signals, and adjusts the skew between the plurality of second parallel signals based on the discovered points.

12. The parallel receiving method of claim 11, wherein the simultaneously receiving of the plurality of first parallel signals and the first deskew signal comprises:

moving at least a part of bits constituting the second parallel signal on a tune axis until pattern of the second parallel signal is consistent with that of the plurality of second deskew signals, and discovers the point of the second parallel signal in which pattern of the second parallel signals is consistent with that of the plurality of second deskew signals.

* * * * *